US010651141B2

(12) United States Patent
Chen et al.

(10) Patent No.: US 10,651,141 B2
(45) Date of Patent: May 12, 2020

(54) CHIP, FLEXIBLE DISPLAY PANEL AND DISPLAY DEVICE

(71) Applicant: BOE Technology Group Co., Ltd., Beijing (CN)

(72) Inventors: Liqiang Chen, Beijing (CN); Paoming Tsai, Beijing (CN); Jianwei Li, Beijing (CN); Chen Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/122,035

(22) Filed: Sep. 5, 2018

(65) Prior Publication Data

US 2019/0148319 A1 May 16, 2019

(30) Foreign Application Priority Data

Nov. 16, 2017 (CN) .......................... 2017 1 1138114

(51) Int. Cl.
*H01L 23/00* (2006.01)
*H01L 27/12* (2006.01)

(52) U.S. Cl.
CPC .............. *H01L 24/05* (2013.01); *H01L 24/13* (2013.01); *H01L 24/14* (2013.01); *H01L 27/1244* (2013.01); *H01L 24/16* (2013.01); *H01L 24/29* (2013.01); *H01L 24/32* (2013.01); *H01L 24/73* (2013.01); *H01L 24/92* (2013.01); *H01L 27/1218* (2013.01); *H01L 2224/05552* (2013.01); *H01L 2224/05553* (2013.01); *H01L 2224/13012* (2013.01); *H01L 2224/13013* (2013.01); *H01L 2224/13014* (2013.01); *H01L 2224/13015* (2013.01); *H01L 2224/14517* (2013.01); *H01L 2224/16014* (2013.01); *H01L 2224/16227* (2013.01); *H01L 2224/2929* (2013.01); *H01L 2224/29198* (2013.01); *H01L 2224/29298* (2013.01); *H01L 2224/32225* (2013.01); *H01L 2224/32227* (2013.01); *H01L 2224/73204* (2013.01); *H01L 2224/92125* (2013.01); *H01L 2924/1426* (2013.01); *H01L 2924/351* (2013.01)

(58) Field of Classification Search
None
See application file for complete search history.

(56) References Cited

U.S. PATENT DOCUMENTS

2010/0148812 A1* 6/2010 Nagai .................. H01L 21/563 324/762.06
2018/0040576 A1* 2/2018 Kim .................... G02F 1/13458
2019/0002741 A1* 1/2019 Ozeki ........................ C09J 4/00

FOREIGN PATENT DOCUMENTS

JP 2013175509 * 9/2013

* cited by examiner

*Primary Examiner* — Long Pham
(74) *Attorney, Agent, or Firm* — Arent Fox LLP; Michael Fainberg

(57) ABSTRACT

The disclosure relates to the field of display technologies and particularly to a chip, a flexible display panel and a display device. The chip includes a body and a plurality of connection terminals arranged on a surface of the body, where each connection terminal is provided with a stress concentration resisting structure for preventing from producing the stress concentration phenomenon.

20 Claims, 4 Drawing Sheets

1
2
3
B
22
21
2

CHIP, FLEXIBLE DISPLAY PANEL AND DISPLAY DEVICE

CROSS-REFERENCES TO RELATED APPLICATIONS

This application claims priority to Chinese patent application No. 201711138114.2 filed on Nov. 16, 2017, which is incorporated herein by reference in its entirety.

FIELD

The disclosure relates to the field of display technologies and particularly to a chip, a flexible display panel and a display device.

BACKGROUND

The flexible display panel is increasingly favored by the majority of users due to the characteristic that it can be bended. In the fabrication process, the flexible display panel tends to use the array substrate which is light and thin and of which the impact-resistance characteristic is good. At present, the display device including the array substrate includes the liquid crystal display device, the organic electroluminescence display device and the electrophoretic display device. The flexible display device can be applied to the mobile phone, smart card, portable computer, electronic paper and other electronic devices.

SUMMARY

In one aspect, an embodiment of the disclosure provides a chip. The chip includes a body and a plurality of connection terminals arranged on a surface of the body, where each of the connection terminals is provided with a stress concentration resisting structure for preventing from producing the stress concentration phenomenon.

In some embodiments, each of the connection terminals has a first end section and a second end section arranged oppositely along its length extension direction, and the stress concentration resisting structure is arranged at the first and second end sections.

In some embodiments, a projection of each of the connection terminals on the surface of the body is a parallelogram, and the stress concentration resisting structure is a fillet arranged at at least one corner of the parallelogram.

In some embodiments, the parallelogram is a rectangle.

In some embodiments, a width of the first end section increases gradually along a direction from the first end section to the second end section and a width of the second end section decreases gradually along the direction from the first end section to the second end section.

In some embodiments, an outer contour of a projection of the first end section on the surface of the body is a trapezoid, polygon or step shape, and an outer contour of a projection of the second end section on the surface of the body is a trapezoid, polygon or step shape.

In some embodiments, each of the connection terminals includes a main body, where the first and second end sections are arranged oppositely on two ends of the main body along a length extension direction of the main body; a width of one end of the first end section towards the main body is less than or equal to a width of the main body, and a width of one end of the second end section towards the main body is less than or equal to the width of the main body.

In some embodiments, the plurality of connection terminals are arranged in an array on the chip.

In some embodiments, the chip includes a drive circuit.

In some embodiments, the plurality of connection terminals include input terminals and output terminals.

In some embodiments, the plurality of connection terminals further include pseudo terminals.

In some embodiments, a length of each of the connection terminals is 80 μm~120 μm and a width of each of the connection terminals is 5 μm~15 μm.

In another aspect, the disclosure further provides a flexible display panel. The flexible display panel includes an array substrate and any chip as provided by the above embodiments. The array substrate is provided with a plurality of connection pads, and the plurality of connection terminals of the chip are connected with the plurality of connection pads in one-to-one correspondence for mounting the chip onto the array substrate.

In some embodiments, the chip is mounted onto the array substrate by a hot pressing process, to enable the connection terminals to electrically connect with the corresponding connection pads.

In some embodiments, conductive particle adhesive is arranged between the connection terminals and the connection pads corresponding to each other.

In some embodiments, an outer contour shape of a surface of each of the connection pads opposite to the corresponding connection terminal is a parallelogram.

In some embodiments, for the connection pads and the connection terminals corresponding to each other, projections of the connection terminals on the array substrate are all located in projections of the connection pads on the array substrate.

In another aspect, the disclosure further provides a display device which includes a flexible display panel. The flexible display panel includes an array substrate and any chip as provided by the above embodiments. The array substrate is provided with a plurality of connection pads, and the plurality of connection terminals of the chip are connected with the plurality of connection pads in one-to-one correspondence for mounting the chip onto the array substrate.

In some embodiments, in the display device, the chip is mounted onto the array substrate by a hot pressing process, to enable the connection terminals to electrically connect with the corresponding connection pads.

In some embodiments, in the display device, conductive particle adhesive is arranged between the connection terminals and the connection pads corresponding to each other.

DETAILED DESCRIPTION

The technical solutions in the embodiments of the disclosure will be described clearly and completely below in combination with the accompanying drawings in the embodiments of the disclosure. Obviously the described embodiments are only a part of the embodiments of the disclosure but not all the embodiments. Based upon the embodiments in the disclosure, all of other embodiments obtained by those ordinary skilled in the art without inventive work fall into to the protection scope of the disclosure.

The fabrication process of the flexible display panel is as follows: firstly the array substrate is fixed on the glass substrate, then the subsequent fabrication process of the back panel is performed, the array substrate and the glass substrate need to be separated after the fabrication is completed, then the film materials (back film) are adhered to the back side of the array substrate to planarize the array substrate, and finally the cutting and the bonding process of the IC (drive circuit) and other chips are performed.

In order to increase the resolution of the flexible display panel, the flexible display panel generally bonds the chip on the array substrate directly. But, since the hardness of the chip is relatively high, the connection terminals of the chip are easy to sink when the chip is connected by the pressure to the array substrate, causing the wires on the array substrate to break. The connection terminals of the chip generally employ the cuboid structure or right parallelepiped structure, where the corners of the connection terminals are easy to produce the stress concentration when the connection terminals are pressure connected, causing the problem that the wires of the array substrate are easy to break.

The embodiments of the disclosure provide a chip, a flexible display panel and a display device. The display device includes the flexible display panel, the flexible display panel includes the above chip. Each connection terminal of the chip is provided with the stress concentration resisting structure for preventing from producing the stress concentration phenomenon, and the probability of producing the stress concentration phenomenon by the chip is reduced by the stress concentration resisting structure, to thereby solve the problem in the related art that the corners of the connection terminals produce the stress concentration when they are pressure connected, to cause the wires of the array substrate to break easily.

Figure 1:
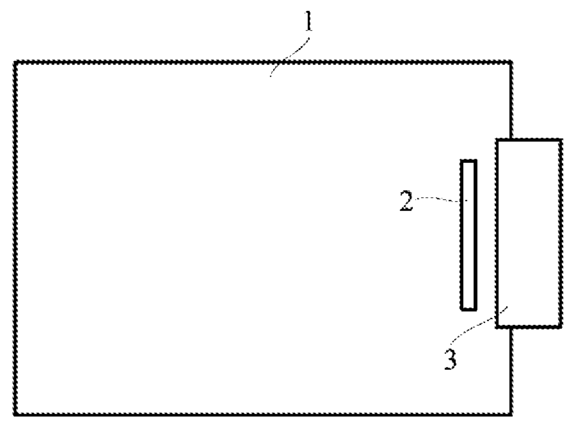
FIG. 1 is a schematic structural diagram of a flexible display panel according to an embodiment of the disclosure.
Figure 4:
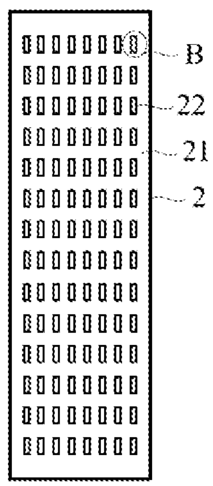
FIG. 4 is a schematic structural diagram of connection terminals of the chip in the flexible display panel according to FIG. 1.

Referring to FIGS. 1 and 4, an embodiment of the disclosure provides a chip 2. The chip 2 includes a body 21 and a plurality of connection terminals 22 arranged on one surface of the body 21. Each connection terminal 22 is provided with a stress concentration resisting structure 223 for preventing from producing the stress concentration phenomenon.

Figure 2:
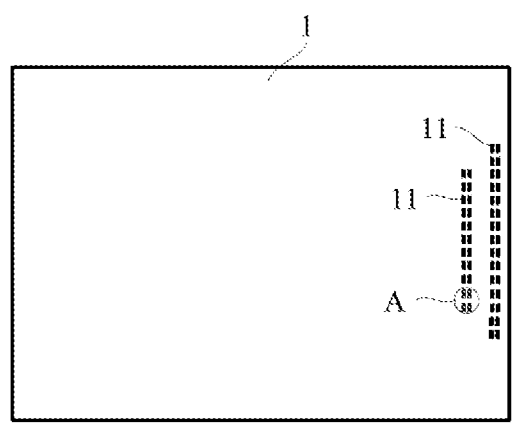
FIG. 2 is a schematic structural diagram of an array substrate of the flexible display panel in FIG. 1.
Figure 5A:
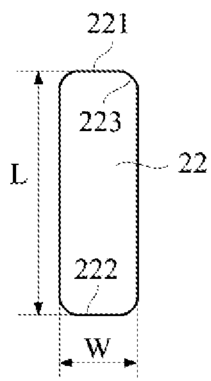
FIGS. 5A-5E are several partially enlarged schematic diagrams of the section B of the chip in FIG. 4.
Figure 5B:
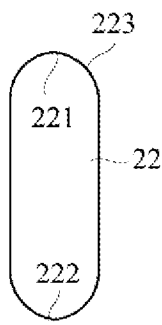
Figure 5C:
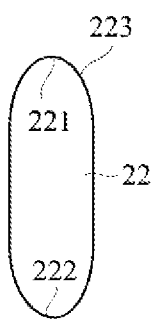
Figure 5D:
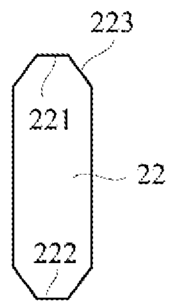
Figure 5E:
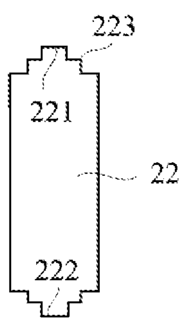

As shown in FIG. 1, the chip 2 and the circuit board 3 may both be mounted onto the array substrate 1, and the chip 2 may include a drive circuit. As shown in FIG. 4, in order to facilitate the signal transmission between the chip 2 and the array substrate 1, the surface of the chip 2 facing to the array substrate 1 is provided with a plurality of connection terminals 22. As shown in FIG. 2, the surface of the array substrate 1 facing to the chip 2 is provided with a plurality of connection pads 11. The chip 2 is mounted onto the connection pads 11 of the array substrate 1 via the connection terminals 22 and connected with the array substrate 1 by the signals, to enable the signals of the chip 2 to output to the array substrate 1 and the signals of the array substrate 1 to output to the chip 2. In order to avoid the problem of producing the stress concentration phenomenon to cause the damage of the array substrate 1 or the chip 2 when the connection terminals 22 are mounted to the connection pads 11, each connection terminal 22 is provided with the stress concentration resisting structure 223. As shown in FIG. 5A, the stress concentration resisting structure 223 arranged at the first end section 221 and the second end section 222 of each connection terminal 22 is a fillet, that is, the fillet processing is performed on the right-angle sides of each connection terminal 22, to prevent from producing the stress concentration due to the right-angle sides and thus damaging the array substrate 1 or the chip 2. As shown in FIGS. 5B and 5C, the first end section 221 and the second end section 222 of each connection terminal 22 are both fabricated as the circular arc structures, and the arc sides of which the transition is smooth are used to form the stress concentration resisting structure 223. As shown in FIG. 5D, the chamfer processing is performed on the right-angle sides of the first end section 221 and the second end section 222 of each connection terminal 22, the chamfer is used to form the stress concentration resisting structure 223, and thus the right-angle sides are replaced with the beveled edges formed by the chamfer to thereby reduce the right-angle sides. As shown in FIG. 5E, the first end section 221 and the second end section 222 of each connection terminal 22 are respectively provided with the grading structures, so that the sizes of the first end section 221 and the second end section 222 increases gradually from the end sections to the body 21, and thus the stress decreases gradually to thereby avoid the occurrence of the stress concentration phenomenon.

In the above chip 2, each connection terminal 22 is provided with the stress concentration resisting structure 223 for preventing from producing the stress concentration phenomenon, so when the chip 2 is pressure connected to the array substrate 1, the probability of producing the stress concentration phenomenon by the chip 2 can be reduced by the stress concentration resisting structure 223 arranged at each connection terminal 22, to thereby reduce the probability of the occurrence of the wire breakage problem of the array substrate 1 due to the stress concentration.

Thus, in the chip 2, the stress concentration resisting structure 223 arranged at each connection terminal 22, which can address the problem that the corners of the connection terminals 22 produce the stress concentration when they are pressure connected to cause the wires of the array substrate 1 to break easily.

In a specific embodiment, as shown in FIGS. 5A-5E, each connection terminal 22 has a first end section 221 and a second end section 222 arranged oppositely along its length extension direction, and the stress concentration resisting structure 223 is arranged at the first end section 221 and the second end section 222.

Specifically, as shown in FIGS. 5A, 5B and 5C, the projection of each connection terminal 22 on one surface of the body 21 can be a parallelogram, and the stress concentration resisting structure 223 can be a fillet arranged at at least one corner of the parallelogram. The parallelogram of the projection of each connection terminal 22 on the surface of the body 21 can be a rectangle, and the stress concentration resisting structure 223 can be a fillet arranged at at least one corner of the rectangle.

When the projection of each connection terminal 22 on one surface of the body 21 is the rectangle, each connection terminal 22 is a cuboid structure. However, the specific structure of each connection terminal 22 can be a cuboid, or can be a cube, or can be a cylinder, a gengon or another structure, and not limited to the cuboid or parallelogram structure as above. The plurality of connection terminals 22 of the chip 2 can include any one or any combination of the connection terminals 22 with the cuboid structure, the connection terminals 22 with the parallelogram structure, the connection terminals 22 with the cylinder structure, and the connection terminals 22 with the gengon structure.

As shown in FIGS. 5A-5E, the width of the first end section 221 increases gradually and the width of the second end section 222 decreases gradually along the direction from the first end section 221 to the second end section 222.

Since the widths of the first end section 221 and the second end section 222 vary gradually, the contact pressure between the connection terminals 22 and the connection pads 11 of the array substrate 1 can vary gradually but not increase sharply to cause the occurrence of the stress concentration phenomenon when the connection terminals are mounted to the array substrate 1.

As shown in FIGS. 5D and 5E, the outer contour of the projection of the first end section 221 on the surface of the body 21 is a trapezoid, polygon or step shape, and the outer contour of the projection of the second end section 222 on the surface of the body 21 is a trapezoid, polygon or step shape.

Each connection terminal 22 can include a main body, where the first end section 221 and the second end section 222 are arranged oppositely on two ends of the main body along the length extension direction of the main body; the width of one end of the first end section 221 towards the main body is less than or equal to the width of the main body, and width of one end of the second end section 222 towards the main body is less than or equal to the width of the main body.

As shown in FIG. 4, the plurality of connection terminals 22 can be arranged in an array on the chip 2. The plurality of connection terminals 22 can also be arranged in a straight line on the surface of the chip 2 along one direction of the chip 2, or the plurality of connection terminals 22 can also be arranged respectively in a plurality of regions of the surface of the chip 2. When the plurality of connection terminals 22 include the input terminals and the output terminals, the input terminals and the output terminals can be arranged oppositely in two regions on the surface of the chip 2 or can be arranged adjacently. When the plurality of connection terminals 22 include the input terminals, the output terminals and the pseudo terminals, then the input terminals, the output terminals and the pseudo terminals can be arranged respectively in the different regions on the surface of the chip 2 or can be arranged in the rows or columns, e.g., arranged parallelly in three rows or three columns on the surface of the chip 2. The plurality of connection terminals 22 can also be arranged in another form according to the specific situation, but not limited to the array arrangement. The specific numbers and the arrangement of the input terminals, the output terminals and the pseudo terminals can be set according to the actual requirements.

As shown in FIG. 5A, in the fabrication process, the length L of each connection terminal 22 can be 80 μm~120 μm, and the width W can be 5 μm~15 μm. For example, the length can be 80 μm, 90 μm, 95 μm, 100 μm, 105 μm, 110 μm, 120 μm; and the width can be 5 μm, 8 μm, 10 μm, 12 μm, 15 μm.

Based on the various embodiments of the chip 2 described above, and in the practical design and application process of the chip 2, among a plurality of connection terminals 22 on the same chip 2, the above connection terminals 22 can be used partly or entirely, or the connection terminals 22 and the widths or other parameters of their first end sections 221 and second end sections 222 can be designed specifically according to the stress distribution condition. Even if all the connection terminals 22 on the same chip 2 use the structure in the above embodiments, the design structures of the first end sections 221 and the second end sections 222 in each connection terminal 22 on the same chip 2 can also be different and not limited to the various embodiments described above.

In addition, an embodiment of the disclosure further provides a flexible display panel, and as shown in FIGS. 1, 2, 3A, 3B and 3C, the flexible display panel includes an array substrate 1 which is provided with a plurality of connection pads 11. The flexible display panel further includes any chip 2 as provided by the above embodiments. A plurality of connection terminals 22 of the chip 2 are connected with the plurality of connection pads 11 in one-to-one correspondence for mounting the chip 2 onto the array substrate 1. As shown in FIG. 2, the array substrate 1 is provided with a plurality of connection pads 11 which can be configured to connect the chip 2 and/or the circuit board 3. The plurality of connection pads 11 can at least correspond to the connection terminals 22 of the chip 2 one by one. Of course, the array substrate 1 can further provided with the connection pads 11 which can be connected with the circuit board 3 such as the flexible circuit board in one-to-one correspondence.

When the chip 2 is mounted onto the array substrate 1, the chip 2 can be mounted onto the array substrate 1 by the hot pressing process, so that the connection terminals 22 and the connection pads 11 corresponding to each other are connected electrically and the communications can be performed among the array substrate 1, the chip 2 and the circuit board 3.

In order to increase the connection strength and protect the connection terminals 22 and the connection pads 11, the conductive particle adhesive can be arranged between the connection terminals 22 and the connection pads 11 corresponding to each other.

By arranging the conductive particle adhesive between the connection terminals 22 and the connection pads 11, the connection strength between the array substrate 1 and the chip 2 can be increased. Further, the connection terminals 22 and the connection pads 11 can be sealed in the conductive particle adhesive, which can protect the connection terminals 22 and the connection pads 11 from being damaged or eroded by the water vapour, to thereby protect the array substrate 1 and the chip 2 and increase the service life of the flexible display panel.

Figure 3A:
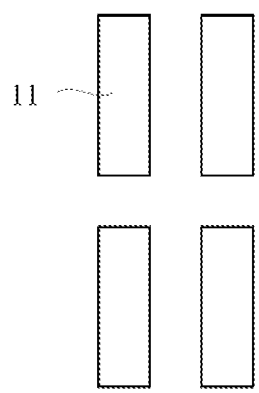
FIG. 3A is a partially enlarged schematic diagram of the section A of the array substrate in FIG. 2.
Figure 3B:
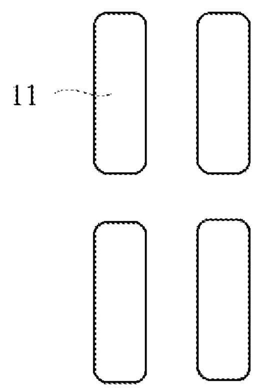
FIG. 3B is another partially enlarged schematic diagram of the section A of the array substrate in FIG. 2.
Figure 3C:
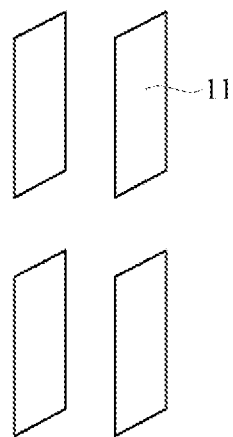
FIG. 3C is another partially enlarged schematic diagram of the section A of the array substrate in FIG. 2.

As shown in FIGS. 3A, 3B and 3C, the outer contour shape of the surface of each connection pad 11 opposite to the corresponding connection terminal 22 can be a parallelogram, and the outer contour shape of the connection pad 11 as shown in FIG. 3A is a rectangle. Similarly, in order to avoid the occurrence of the stress concentration phenomenon, the fillet processing can also be performed on the right-angle sides of the connection pad 11, and the outer contour shape of the connection pad 11 after the fillet processing is as shown in FIG. 3B.

Figure 6:
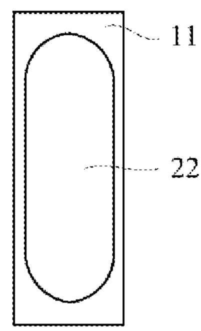
FIG. 6 is a schematic structural diagram of the connection of a connection terminal with a connection pad when the chip is mounted onto the array substrate.

In order to increase the reliability of the connection between the chip 2 and the array substrate 1, as shown in FIG. 6, in the connection pads 11 and the connection terminals 22 corresponding to each other, the projections of the connection terminals 22 on the array substrate 1 are all located in the projections of the connection pads 11 on the array substrate 1.

Since the projections of the connection terminals 22 on the array substrate 1 are all located in the projections of the connection pads 11 on the array substrate 1, when the connection terminals 22 of the chip 2 are mounted onto the connection pads 11 of the array substrate 1, the connection terminals 22 can be in alignment with the connection pads 11 easily, the alignment time of the connection terminals 22 and the connection pads 11 can be shortened, and the mounting efficiency of the chip 2 is increased.

In the practical production and fabrication process, the projections of the connection terminals 22 on the array substrate 1 can also be partially located in the projections of the connection pads 11 on the array substrate 1.

An embodiment of the disclosure further provides a display device which includes any flexible display panel as provided by the above embodiments. The display device can be a flexible display device and can be applied to the field of display, mobile phone, tablet computer, electronic book or the like.

Evidently those skilled in the art can make various modifications and variations to the embodiments of the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A chip, comprising a body and a plurality of connection terminals arranged on a surface of the body, each of the connection terminals is provided with a stress concentration resisting structure for preventing from producing a stress concentration phenomenon caused by corners of the connection terminals when the chip is connected to an array substrate, wherein each of the connection terminals has a first end section and a second end section arranged oppositely along its length extension direction, and the stress concentration resisting structure is arranged at the first and second end section, and wherein a projection of each of the connection terminals on the surface of the body is a parallelogram, and the stress concentration resisting structure is a fillet arranged at least one corner of the parallelogram.

2. The chip according to claim 1, wherein the parallelogram is a rectangle.

3. The chip according to claim 1, wherein a width of the first end section increases gradually along a direction from the first end section to the second end section and a width of the second end section decreases gradually along the direction from the first end section to the second end section.

4. The chip according to claim 3, wherein each of the connection terminals comprises a main body, where the first and second end sections are arranged oppositely on two ends of the main body along a length extension direction of the main body; a width of one end of the first end section towards the main body is less than or equal to a width of the main body, and a width of one end of the second end section towards the main body is less than or equal to the width of the main body.

5. The chip according to claim 1, wherein the plurality of connection terminals are arranged in an array on the chip.

6. The chip according to claim 5, wherein the chip comprises a drive circuit.

7. The chip according to claim 1, wherein the plurality of connection terminals comprise input terminals and output terminals.

8. The chip according to claim 7, wherein the plurality of connection terminals further comprise dummy terminals.

9. The chip according to claim 1, wherein a length of each of the connection terminals is 80 μm~120 μm and a width of each of the connection terminals is 5 μm~15 μm.

10. A flexible display panel, comprising an array substrate and the chip according to claim 1, the array substrate is provided with a plurality of connection pads, and the plurality of connection terminals of the chip are connected with the plurality of connection pads in one-to-one correspondence for mounting the chip onto the array substrate.

11. The flexible display panel according to claim 10, wherein the chip is mounted onto the array substrate by a hot pressing process, to enable the connection terminals to electrically connect with the corresponding connection pads.

12. The flexible display panel according to claim 10, wherein conductive particle adhesive is arranged between the connection terminals and the connection pads corresponding to each other.

13. The flexible display panel according to claim 10, wherein an outer contour shape of a surface of each of the connection pads opposite to the corresponding connection terminal is a parallelogram.

14. The flexible display panel according to claim 13, wherein for the connection pads and the connection terminals corresponding to each other, projections of the connection terminals on the array substrate are all located in projections of the connection pads on the array substrate.

15. A display device comprising the flexible display panel according to claim 10.

16. A chip, comprising a body and a plurality of connection terminals arranged on a surface of the body, each of the connection terminals is provided with a stress concentration resisting structure for preventing from producing a stress concentration phenomenon caused by corners of the connection terminals when the chip is connected to an array substrate;

wherein each of the connection terminals has a first end section and a second end section arranged oppositely along its length extension direction, and the stress concentration resisting structure is arranged at the first and second end section;

wherein an outer contour of a projection of the first end section on the surface of the body is a step shape, and an outer contour of a projection of the second end section on the surface of the body is a step shape.

17. The chip according to claim 16, wherein a width of the first end section increases gradually along a direction from the first end section to the second end section and a width of the second end section decreases gradually along the direction from the first end section to the second end section.

18. The chip according to claim 17, wherein each of the connection terminals comprises a main body, where the first and second end sections are arranged oppositely on two ends of the main body along a length extension direction of the main body; a width of one end of the first end section towards the main body is less than or equal to a width of the main body, and a width of one end of the second end section towards the main body is less than or equal to the width of the main body.

19. The chip according to claim 16, wherein the plurality of connection terminals comprise input terminals and output terminals.

20. A flexible display panel, comprising an array substrate and the chip according to claim 16, the array substrate is provided with a plurality of connection pads, and the plurality of connection terminals of the chip are connected with the plurality of connection pads in one-to-one correspondence for mounting the chip onto the array substrate.

* * * * *